Nov. 2, 1965 R. P. MASSEY 3,215,952

TRANSISTOR INVERTER WITH FREQUENCY STABILITY
PROVIDED BY REVERSE BASE CURRENT INJECTION

Filed March 5, 1963

INVENTOR
R. P. MASSEY
BY R. B. Anderson
ATTORNEY 3,215,952
Patented Nov. 2, 1965

3,215,952

TRANSISTOR INVERTER WITH FREQUENCY STABILITY PROVIDED BY REVERSE BASE CURRENT INJECTION

Richard P. Massey, Westfield, N.J., assignor to Bell Telephone Laboratories, Incorporated, New York, N.Y., a corporation of New York Filed Mar. 5, 1963, Ser. No. 262,870
4 Claims. (Cl. 331—113)

Figures 1, 2:
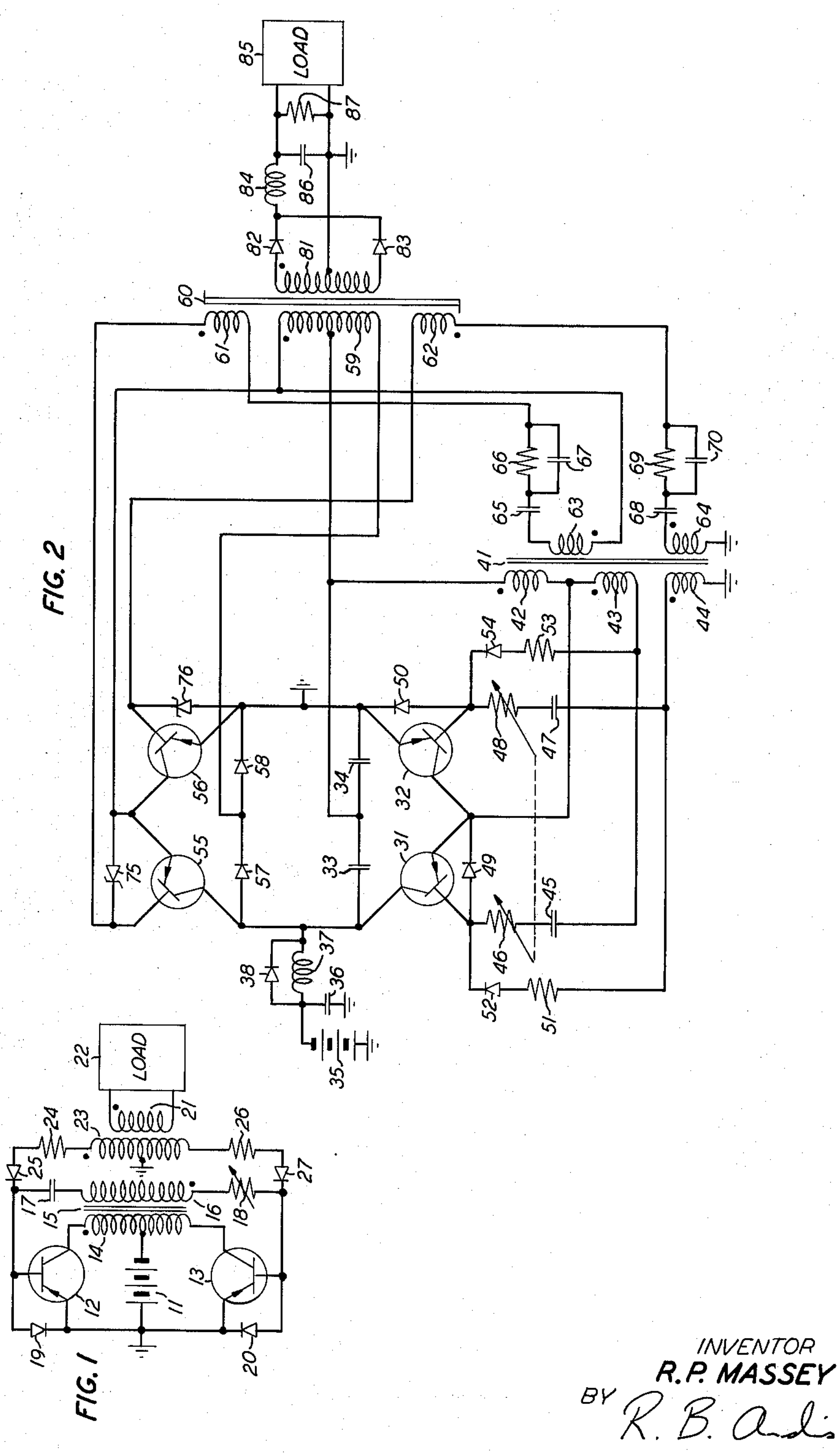

This invention relates generally to semiconductor electrical current conversion circuits and more particularly to the class of transistor electrical current conversion circuits known as inverters.

In powering electronic apparatus, it is frequently necessary to convert a direct current into an alternating current, either as one step in converting the direct current to another direct current at a different voltage level or to provide a needed alternating current when only direct current is available. Devices performing this function are commonly known as inverters and frequently employ transistors in order to derive the usual advantages of reliability, compactness, and lack of unnecessary heat generation. Typically, a transistor inverter takes the form of a pair of transistor switches connected to receive current from a direct-current source, an output transformer connected to receive current in one direction from one of the transistor switches and in the opposite direction from the other, and regenerative feedback paths connected from the output transformer to both of the transistor switches to render them alternately conducting and non-conducting in phase opposition to one another. In such inverters, the switching rate is normally primarily determined either by the characteristics of the output transformer or by one or more timing capacitors contained in the regenerative feedback paths.

Unfortunately for some applications, the frequency of the alternating current generated by transistor inverters tends to be sensitive to input voltage variations. $I_{co}$, the transistor collector current which still flows in the absence of emitter current, varies with such environmental factors as input voltage and temperature. Since switching takes place when the base current of the conducting transistor has dropped to a predetermined fraction of the collector current, variations in the additional component of collector current, $I_{co}$, are reflected as variations in operating frequency. The frequency variations are significant whenever the $I_{co}$ variations are substantial.

A principal object of the invention is to stabilize the frequency of a transistor inverter against changes in input voltage.

Another object is to provide such stabilization in as simple, reliable, and economical a manner as possible.

In accordance with a principal feature of the invention, the operating frequency of a transistor inverter is stabilized against changes in input voltage by injecting into the base of the conducting transistor a reverse current at least as large as the maximum $I_{co}$ for that transistor. In an inverter making use of the invention, the base current of the conducting transistor now drops toward a negative value determined by its maximum $I_{co}$ rather than toward zero and passes through the switching range in a much shorter time interval. The switching point is thus more accurately defined under all operating conditions and the switching rate is relatively insensitive even to substantial changes in the $I_{co}$ component of transistor collector current.

In transistor inverters embodying the invention, the reverse current injected into the base of each transistor is generally derived from the output transformer and injected through a diode and a current-limiting resistor.

The diode is poled to pass only current in the direction of reverse base current and the resistor is fixed in value to limit the current to a value only slightly in excess of the maximum transistor $I_{co}$. More reverse current would be unnecessarily wasteful of power, while less would not succeed fully in stabilizing the frequency of the converter under all operating conditions.

A more complete understanding of the invention may be obtained from a study of the following detailed description of several specific embodiments. In the drawing:

FIG. 1 illustrates one type of transistor inverter embodying the invention in an arrangement yielding an alternating-current output; and FIG. 2 illustrates a somewhat different type of transistor inverter embodying the invention in an arrangement used to provide precise frequency control of another inverter in an open-loop voltage regulator.

In the embodiment of the invention illustrated in FIG. 1, a direct-current source 11 is connected to supply current to a pair of p-n-p transistor switches 12 and 13. The positive terminal of source 11 is grounded and connected to the emitter electrodes of both transistors, while the negative terminal is connected to the midpoint of a winding 14 of an output transformer 15. Winding 14 is, in turn, connected between the collector electrodes of transistors 12 and 13. Regenerative feedback is provided in FIG. 1 by a second winding 16 of transformer 15 connected in series with a timing capacitor 17 and a variable timing resistor 18 between the base electrodes of transistors 12 and 13. A diode 19 is connected between the base and emitter electrodes of transistor 12 and poled toward the latter electrode, while a diode 20 is similarly connected and poled between the base and emitter electrodes of transistor 13. Still another winding 21 of transformer 15 serves as the output winding and is connected to the load 22. The relative polarities of the transformer windings are as indicated by the dots.

To the extent thus far described, the transistor inverter of FIG. 1 and its operation are conventional. When transistor 12 is in its conducting (saturated) state, current flows from source 11 through its emitter-collector path and the upper portion of winding 14. Since winding 16 is poled oppositely from winding 14, as illustrated, the induced voltage on winding 16 is negative at the base of transistor 12 and holds transistor 12 in the conducting state. Timing capacitor 17 charges at a rate determined primarily by timing resistor 18, the charging current path consisting of diode 20 and the emitter-base junction of transistor 12 in addition to winding 16 and timing resistor 18. The voltage developed across diode 20 provides a reverse bias for the emitter-base junction of transistor 13, holding transistor 13 in its substantially non-conducting state.

As timing capacitor 17 in FIG. 1 charges, the base current of transistor 12 decreases exponentially. When it drops to the value $I_c/\beta$, where $I_c$ is the collector current flowing in the transistor and $\beta$ is the transistor common-emitter current gain, transistor 12 comes out of saturation. As timing capacitor 17 continues to charge, the reverse bias on the emitter-base junction of transistor 13 continues to decrease. By regenerative action, transistor 13 then switches into its conducting (saturated) state and transistor 12 switches into its substantially non-conducting state. At that moment, the current in winding 14 of output transformer 15 reverses, since it is received from transistor 13 rather than transistor 12. All other windings reverse polarity as a result and timing capacitor 17 charges in the opposite direction. The cycle repeats itself to maintain oscillation and alternating current is supplied from winding 21 to load 22.

As has already been pointed out, a difficulty with a transistor inverter of the type described up to this point is the tendency for the frequency of the alternating-current output wave to be highly sensitive to changes in input voltage. Every transistor has a component of collector current known as $I_{co}$, the collector current which still flows in the absence of emitter current. $I_{co}$ varies with input voltage and has the effect of imposing a similar variation upon $I_c$. In the inverter thus far described, transistor base current decreases exponentially towards zero as timing capacitor 17 is being charged and by the time it reaches the vicinity of $I_c/\beta$, is not dropping as rapidly as it did initially. Small variations in the $I_{co}$ component of $I_c$ can, therefore, cause the instant at which the conducting transistor comes out of saturation to be advanced or delayed. An unwanted variation in the frequency of the alternating-current output wave results.

In accordance with the invention, the frequency of the transistor inverter shown in FIG. 1 is stabilized against input voltage changes by a fourth winding 23 of transformer 15 connected to inject into the base of each transistor when conducting a reverse current at least equal in magnitude to the maximum $I_{co}$ for that transistor. The midpoint of winding 23 is grounded. One end is connected to the base of transistor 12 through a current-limiting resistor 24 and a diode 25 and the other end is connected to the base of transistor 13 through a similar current-limiting resistor 26 and diode 27. As illustrated, diodes 25 and 27 are poled for easy current flow toward the base electrodes of the respective transistors. Resistors 24 and 26 and the turns ratio of the transformer fix the injected currents at at least the maximum values of $I_{co}$ for the respective transistors. The injected currents are preferably limited, however, to values only slightly in excess of the maximum values of $I_{co}$ in order to afford complete frequency stability while still avoiding undue power loss.

FIG. 2 illustrates a D.-C. to D.-C. converter in which a transistor inverter embodying the invention is used to provide precise frequency control of a second transistor inverter powered from the same input voltage source. The entire converter, which forms the basis for applicant's copending application Serial No. 263,062, filed concurrently with the present application, functions to provide D.-C. output voltage regulation without the use of a closed feedback loop.

The frequency-stabilized driving inverter in FIG. 2 is in the form of a four-terminal bridge circuit in which a pair of p-n-p transistors 31 and 32 form one pair of adjacent arms and a pair of voltage-dividing capacitors 33 and 34 the other. As illustrated, the emitter-collector paths of transistors 31 and 32 are connected in series with one another, with the emitter of transistor 31 and the collector of transistor 32 forming one of the four terminals of the bridge. To apply a direct input voltage across one diagonal of the bridge, the terminal formed by capacitor 34 and the emitter of transistor 32 is grounded and the one formed by capacitor 33 and the collector of transistor 31 is connected to the negative side of a D.-C. source 35 through a smoothing filter consisting of a shunt capacitor 36 and a series inductor 37. In addition, a germanium diode 38 is connected across inductor 37 to eliminate any voltage transients created by turning the converter on and off. The output of the frequency-stabilized inverter is taken from a transformer 41, one winding 42 of which is connected from the bridge terminal between capacitors 33 and 34 to that formed by the emitter of transistor 31 and the collector of transistor 32.

Regenerative feedback is provided in the driving inverter by two additional windings 43 and 44 of transformer 41. The relative polarities of the windings are as indicated by the dots. One end of winding 43 is connected to the emitter of transistor 31, while the other is connected through a timing capacitor 45 and a timing resistor 46 to the base of transistor 31. One end of winding 44, on the other hand, is grounded (as is the emitter of transistor 32) while the other is connected through a timing capacitor 47 and a timing resistor 48 to the base of transistor 32. Timing resistors 46 and 48 are variable and ganged, as illustrated, to provide fine control of the driving inverter operating frequency. Finally, a diode 49 is connected between the base and emitter electrodes of transistor 31 and poled toward the latter electrode, while a diode 50 is similarly connected and poled between the base and emitter electrodes of transistor 32.

In operation, transistors 31 and 32 of the driving inverter conduct alternately. The voltage division between capacitors 33 and 34 is substantially equal. When transistor 32 is conducting (in saturation), half of the input voltage is applied to winding 42 and induces voltages on the other windings of transformer 41. The voltage on winding 42 is negative at the dot, as are those on windings 43 and 44. The negative potential applied to timing capacitor 47 by winding 44 holds transistor 32 in its conducting state, while the positive potential applied to capacitor 45 by winding 43 and developed across diode 49 holds transistor 31 in its non-conducting state. As capacitor 47 charges, the base current of transistor 32 decreases exponentially. When it reaches the value $I_c/\beta$, transistor 32 comes out of saturation and the voltage across its emitter-collector path increases. At the same time, the reverse bias on transistor 31 decreases as capacitor 45 charges. By regenerative action, transistor 31 switches to its conducting (saturated) state and transistor 32 switches to its non-conducting state. The voltage across winding 42 of transformer 41 reverses and the induced voltages across all of the other windings of transformer 41 also reverse. The cycle repeats itself, maintaining oscillation, with the frequency determined primarily by the time constant of capacitor 45 and resistor 46 and by the time constant of capacitor 47 and resistor 48.

In accordance with the invention, the frequency of the driving inverter formed by transistors 31 and 32 in FIG. 2 is stabilized against input voltage variations by a pair of diode-resistor networks connected to inject into the base of each transistor when conducting a reverse current at least equal in magnitude to the maximum $I_{co}$ for that transistor. One of these networks, made up of the serial combination of a current-limiting resistor 51 and a diode 52, is connected from the end of transformer winding 44 indicated by the dot to the base of transistor 31. The other, consisting of the serial combination of a current-limiting resistor 53 and a diode 54, is connected from the end of winding 43 remote from the dot to the base of transistor 32. Diodes 52 and 54 are both poled toward the base electrodes of their respective transistors and resistors 51 and 53 both cooperate with their respective transformer windings to fix the injected current at at least the maximum value of $I_{co}$ for their respective transistors. As before, the injected currents are preferably limited to values only slightly in excess of the maximum values of $I_{co}$ in order to provide complete frequency stability without unnecessary loss of power.

The frequency-stabilized transistor inverter embodying the invention is shown in FIG. 2 driving a second higher power transistor inverter which is without independent frequency stabilization. This second inverter is of the same general type as the first. It takes the form of another four-terminal bridge circuit in which a pair of p-n-p transistors 55 and 56 form one pair of adjacent arms and voltage-dividing capacitors 33 and 34 form the other. A pair of diodes 57 and 58 are connected in series with one another across capacitors 33 and 34 to assist in maintaining exact voltage division across the capacitor voltage divider. As illustrated, diodes 57 and 58 are poled from D.-C. source 35 toward ground so that they are biased in the reverse direction.

The output from the power inverter is taken from the bridge diagonal between the terminal formed by the respective emitter and collector electrodes of transistors 55 and 56 and the terminal formed between capacitors 33 and 34. Half of a center-tapped winding 59 of a saturable output transformer 60 is connected across that diagonal. The other half of winding 59 is connected, as illustrated, from the junction of capacitors 33 and 34 to the junction between diodes 57 and 58. Exact voltage division across the capacitor voltage divider is obtained by the use of this portion of winding 59 in conjunction with diodes 57 and 58. If the voltage across capacitor 34 tends to rise while transistor 56 is conducting, due to an unbalance in the capacities of the two capacitors, the voltage across the upper portion of winding 59 also tends to rise. The voltage across the lower portion of the winding rises at the same time. Since the resulting voltage across the lower portion of winding 59 is greater than the voltage across capacitor 33, the ensuing current through diode 57 charges capacitor 33 and restores equal voltage division. Similarly, if the voltage across capacitor 33 tends to exceed that across capacitor 34, then diode 58 conducts and restores equal voltage division.

Regenerative feedback in the power inverter in FIG. 2 is provided by a pair of additional windings 61 and 62 of saturable transformer 60. As illustrated, winding 61 is connected to the base of transistor 55, while winding 62 is connected to that of transistor 56. To provide accurate control of the frequency of the power inverter, output transformer 41 of the driving inverter which, in accordance with the invention, is stabilized in frequency against variations in input voltage magnitude, is equipped with a pair of output windings 63 and 64. One end of winding 63 is connected through a capacitor 65 and a current-limiting resistor 66 to the end of winding 61 remote from transistor 55. Resistor 66 is shunted by a capacitor 67. The other end of winding 63 is connected to the bridge terminal formed by the junction between the emitter of transistor 55 and the collector of transistor 56. One end of winding 64, on the other hand, is connected through a capacitor 68 and a current-limiting resistor 69 to the end of winding 62 remote from transistor 56. Resistor 69 is shunted by a capacitor 70. The other end of winding 64 is grounded. The relative polarities of all of the windings of transformers 41 and 60 are as indicated in FIG. 2 by the dots. Finally, a first Zener diode 75 is connected between the emitter and base electrodes of transistor 55 and poled in the forward direction toward the base, while a second Zener diode 76 is similarly connected and poled between the emitter and base electrodes of transistor 56.

The power inverter in FIG. 2 operates in both frequency and phase synchronism with the driving inverter. Transistors 31 and 55 conduct in phase with one another, as do transistors 32 and 56. When transistors 32 and 56 are conducting, the voltages across windings 63 and 64 of transformer 41 are negative at the dots and series additive with those across windings 61 and 62 of transformer 60. The combined voltage across windings 62 and 64 forward biases Zener diode 76 and the base-emitter junction of transistor 56, driving transistor 56 into full conduction. This base driving current, the bulk of which flows through transistor 56 rather than through diode 76, is limited by resistor 69 and charges capacitors 68 and 70. At the same time, the combined voltage across windings 61 and 63 breaks down Zener diode 75 in the reverse direction, charging capacitors 65 and 67 through current-limiting resistor 66. Since Zener diode 75 is in breakdown, it provides a reverse cut-off voltage for transistor 55 and holds it in its non-conducting state.

The core of transformer 60 in FIG. 2 is of the rectangular hysteresis loop variety and saturates before the base currents in the driving inverter transistors decrease to the switching point. When the core of transformer 60 saturates, there is no further change in flux and all winding voltages fall to zero. The difference between the voltage across capacitor 68 and that across winding 64 of transformer 41 is positive and small enough not to break down Zener diode 76. Also, the sum of the voltage across capacitor 65 and that across winding 63 of transformer 41 is positive and small enough not to break down Zener diode 75. Since Zener diodes 75 and 76 are reverse biased, they are effective open circuits, causing both transistors 55 and 56 of the power inverter to be non-conducting.

When transistors 31 and 32 of the driving inverter switch so that transistor 31 conducts and transistor 32 is shut off, the voltages across windings 63 and 64 of transformer 41 reverse polarity. The sum of the voltages across capacitors 68 and 70 and the voltage across winding 64 of transformer 41 is positive and high enough to break down Zener diode 76. Transistor 56 is thus held in its non-conducting state. At the same time, the difference between the voltage across capacitor 65 and the voltage across winding 63 of transformer 41 is negative, forward biasing Zener diode 75 and the base-emitter junction of transistor 55. Transistor 55 is thereby driven into conduction. The voltage on the upper portion of winding 59 of transformer 60 then reverses polarity and the cycle repeats. Capacitors 67 and 70 help decrease the turn-off time of power inverter transistors 55 and 56.

The output voltage of the power inverter in FIG. 2 appears at an output winding 81 of transformer 60 as alternate halves of a square wave separated by zero voltage intervals. Full-wave rectification is provided by a pair of diodes 82 and 83, each connected to an opposite end of output winding 81. The rectified voltage is filtered by passing it through a series inductor 84 to the load 85. A shunt capacitor 86 between inductor 84 and load 85 aids in the filtering. A bleeder resistor 87 is shunted across load 85 to limit output voltage in the event of an open-circuited load.

Line voltage regulation without a closed feedback loop in the over-all converter illustrated in FIG. 2 is achieved by the use of material having a substantially rectangular hysteresis loop for the core of transformer 60. Such a material has a constant volt-time product. For this reason, transformer 60 saturates earlier in the cycle when the voltage applied to the upper portion of winding 59 increases and later when that voltage decreases. Since there is no further change in flux when transformer 60 saturates, all winding voltages fall to zero, switching the conducting one of power inverter transistors 55 and 56 to its non-conducting state. Since the other transistor is not switched to its conducting state until the corresponding transistor in the driving inverter begins to conduct, the over-all period of the output wave appearing on output winding 81 of transformer 60 consists of one conduction interval and one zero voltage interval of transistor 56 followed by one conduction interval and one zero voltage interval of transistor 55. If the input voltage supplied by D.-C. source 35 increases, the conduction intervals shorten and the zero voltage intervals lengthen by a corresponding amount. If the input voltage decreases, on the other hand, the conduction intervals lengthen and the zero voltage intervals shorten. Since the overall period of the power inverter output wave is held constant by the driving inverter even though the input voltage changes, the average value of the rectified output of the power inverter is held constant. The final filtered output voltage appearing across load 85 is thereby made independent of input voltage variations and a regulating effect is achieved without the use of a closed feedback loop.

It is to be understood that the above-described arrangements are illustrative of the application of the principles of the invention. Numerous other arrangements may be devised by those skilled in the art without departing from the spirit and scope of the invention.

What is claimed is:

1. A frequency-stabilized inverter which comprises a source of direct input current, a pair of transistors each having an emitter electrode, a collector electrode, and a base electrode, means connecting both of said transistors to receive current in their emitter-collector paths from said source, an output transformer connected to receive emitter-collector current in one direction from one of said transistors and in the opposite direction from the other of said transistors, feedback paths connected from said output transformer to the base and emitter electrodes of both of said transistors to render their emitter-collector paths alternately conducting and substantially non-conducting in phase opposition to one another, capacitive timing means connected in said feedback paths to provide primary control of the rate at which the emitter-collector paths of said transistors alternate conductivity states, and means to inject into the base electrode of each of said transistors during substantially all of each interval its emitter-collector path is conducting a reverse current at least as large as the maximum $I_{co}$ for that transistor, where $I_{co}$ is the transistor collector current which flows in the absence of emitter current.

2. A frequency-stabilized inverter which comprises a source of direct input current, a pair of transistors each having an emitter electrode, a collector electrode, and a base electrode, means connecting both of said transistors to receive current in their emitter-collector paths from said source, an output transformer having a plurality of inductively coupled windings, means connecting one of said windings to receive emitter-collector current in one direction from one of said transistors and in the opposite direction from the other of said transistors, regenerative feedback means including at least one other of said windings and the base electrodes of said transistors connected to render the respective emitter-collector paths of said transistors alternately conducting and substantially non-conducting in phase opposition to one another, capacitive timing means connected in said feedback paths to provide primary control of the rate at which the respective emitter-collector paths of said transistors alternate conductivity states, and means including at least one another of said windings and the base electrodes of said transistors to inject into the base electrodes of each of said transistors during substantially all of each interval its emitter-collector path is conducting a reverse current at least as large as the maximum $I_{co}$ for that transistor, where $I_{co}$ is the transistor collector current which flows in the absence of emitter current.

3. A frequency-stabilized inverter which comprises a source of direct input current, a pair of transistors of like conductivity type each having an emitter electrode, a collector electrode, and a base electrode, an output transformer having a plurality of inductively coupled windings, means connecting a first of said windings between the collector electrodes of said transistors, means connecting said source from the emitter electrodes of said transistors to an intermediate point on said first winding, said source being poled to pass current through the respective emitter-collector paths of said transistors in the forward direction of conductivity, capacitive timing means connecting a second of said windings between the base electrodes of said transistors to render the respective emitter-collector paths of said transistors alternately conducting and substantially non-conducting in phase opposition to one another, and means including a third and a fourth of said windings each coupled between the base and emitter electrodes of respective ones of said transistors to inject into the base electrode of each of said transistors during substantially all of each interval its emitter-collector path is conducting a reverse current at least as large as the maximum $I_{co}$ for that transistor, where $I_{co}$ is the transistor collector current which flows in the absence of emitter current.

4. A frequency-stabilized inverter which comprises a source of direct input current, a pair of transistors of like conductivity type each having an emitter electrode, a collector electrode, and a base electrode, an output transformer having a plurality of inductively coupled windings, a four-terminal bridge circuit having the emitter-collector paths of said transistors connected to form one pair of adjacent arms thereof, the emitter electrode of one of said transistors and the collector electrode of the other forming one pair of diagonally opposite terminals of said bridge circuit, means connecting said source between said pair of diagonally opposite terminals of said bridge circuit, said source being poled to pass current through the respective emitter-collector paths of said transistors in the forward direction of conductivity, means connecting a first of said windings between the remaining pair of diagonally opposite terminals of said bridge circuit, capacitive timing means connecting a second and a third of said windings between the base and emitter electrodes of respective ones of said transistors to render their emitter-collector paths alternately conducting and substantially non-conducting in phase opposition to one another, and cross-coupling means connecting said second and third windings to the base electrodes of opposite ones of said transistors to inject the base of each of said transistors during substantially all of each interval its emitter-collector path is conducting a reverse current at least as large as the maximum $I_{co}$ for that transistor, where $I_{co}$ is the transistor collector current which flows in the absence of emitter current.

References Cited by the Examiner

UNITED STATES PATENTS

| | | | |
|---|---|---|---|
| 2,993,127 | 7/61 | Noll | 307—88.5 |
| 3,008,068 | 11/61 | Wilting et al. | 331—113 |
| 3,034,073 | 5/62 | Newell et al. | 331—114 |
| 3,067,378 | 12/62 | Paynter | 331—113 |
| 3,134,948 | 5/64 | Wilting | 331—113 |
| 3,146,406 | 8/64 | Wilting | 331—113 |

OTHER REFERENCES

"An Amplitude Stabilized Transistor Oscillator," by Kretzmer in Proc. IRE, vol. 42, pages 391–401. February 1954.

ROY LAKE, *Primary Examiner.*

JOHN KOMINSKI, *Examiner.*